US006793781B2

(12) United States Patent
Finley

(10) Patent No.: US 6,793,781 B2
(45) Date of Patent: Sep. 21, 2004

(54) CATHODE TARGETS OF SILICON AND TRANSITION METAL

(75) Inventor: James J. Finley, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 10 days.

(21) Appl. No.: 10/077,262

(22) Filed: Feb. 15, 2002

(65) Prior Publication Data

US 2002/0125130 A1 Sep. 12, 2002

Related U.S. Application Data

(63) Continuation-in-part of application No. 08/929,176, filed on Sep. 8, 1997, now Pat. No. 6,365,014, which is a division of application No. 08/398,932, filed on Mar. 6, 1995, now Pat. No. 5,709,938, which is a continuation-in-part of application No. 08/041,015, filed on Mar. 31, 1993, now Pat. No. 5,417,827, which is a continuation-in-part of application No. 07/981,706, filed on Nov. 25, 1992, now Pat. No. 6,139,969, which is a continuation-in-part of application No. 07/799,806, filed on Nov. 29, 1991, now Pat. No. 6,274,244.

(51) Int. Cl.[7] .................. C23C 14/34; C22C 27/00; C22C 29/00; C22C 35/00; C01B 33/00

(52) U.S. Cl. .................. 204/192.23; 204/192.22; 204/298.13; 148/423; 420/428; 420/578; 423/324; 423/326

(58) Field of Search .................. 204/192.15, 192.22, 204/192.23, 298.13; 148/423; 420/428, 578; 423/326, 324

(56) References Cited

U.S. PATENT DOCUMENTS

| 3,555,345 A | 1/1971 | Collings et al. ............... 315/11 |
| 4,157,315 A | 6/1979 | Michels et al. ............... 252/458 |
| 4,450,201 A | 5/1984 | Brill et al. .................. 428/336 |
| 4,586,957 A | 5/1986 | Masumoto et al. ............ 75/124 |
| 4,721,991 A | 1/1988 | Ohtaki et al. ................. 357/67 |
| 4,758,321 A | 7/1988 | Vugts ..................... 204/192.21 |
| 4,769,291 A | 9/1988 | Belkind et al. .............. 428/630 |
| 4,846,949 A | 7/1989 | Tu et al. ................. 204/192.21 |
| 4,847,157 A | 7/1989 | Goodman et al. ........... 428/426 |
| 4,857,094 A | 8/1989 | Groth et al. ................. 65/60.2 |
| 4,990,234 A | 2/1991 | Szczyrbowski et al. ..................... 204/192.23 |
| 4,992,087 A | 2/1991 | Holscher .................... 65/60.2 |
| 4,992,095 A | 2/1991 | Nate et al. ..................... 75/246 |
| 5,170,291 A | 12/1992 | Szczyrbowski et al. ..... 359/580 |
| 5,282,946 A | 2/1994 | Kinoshita et al. ....... 204/298.13 |
| 5,320,729 A | 6/1994 | Narizuka et al. ....... 204/298.13 |
| 5,417,827 A | 5/1995 | Finley .................... 204/192.28 |
| 5,709,938 A | 1/1998 | Finley ........................ 428/336 |
| 6,139,969 A | 10/2000 | Finley ........................ 428/432 |
| 6,274,244 B1 | 8/2001 | Finley et al. ................ 428/433 |
| 6,365,014 B2 | 4/2002 | Finley .................... 204/192.23 |

FOREIGN PATENT DOCUMENTS

| BE | 550365 | 9/1956 | ........... C03C/14/34 |
| DE | 218493 | 2/1985 | ........... C23C/14/17 |
| EP | 0 226 993 | 7/1987 | ........... C03C/17/36 |
| EP | 0 233 003 | 8/1987 | ........... C03C/17/36 |
| EP | 0 239 280 | 9/1987 | ........... C03C/17/34 |
| EP | 0 281 894 | 9/1988 | ........... C03C/17/36 |
| EP | 0 301 755 | 2/1989 | ........... C03C/17/00 |
| EP | 0 546 302 | 6/1993 | ........... C03C/17/34 |
| GB | 2138026 | 10/1984 | ........... C23C/15/00 |
| GB | 2201428 | 9/1988 | ........... C23C/14/14 |
| JP | 59-157282 | 9/1984 | ........... C22C/19/05 |
| JP | 63-242948 | 10/1988 | ........... C03C/17/36 |
| JP | 2-250964 | 10/1990 | ........... C23C/14/34 |
| JP | 91-311723 | 10/1991 | ........... C03C/17/34 |
| JP | 4-276070 | 10/1992 | ........... C23C/14/35 |
| JP | 5-86456 | 4/1993 | ........... C23C/14/17 |
| JP | 5-247638 | 9/1993 | ........... C23C/14/34 |
| WO | 88/01568 | 3/1988 | ........... B32B/17/10 |
| WO | 90/09883 | 9/1990 | ........... B32G/7/02 |

OTHER PUBLICATIONS

E. Randich et al., "Chemically Vapor–Deposited $ZrB_2$, As a Selective Solar Absorber", Thin Solid Films, 83 (1981) pp. 393–398.

B. Karlsson et al., "Optical Properties of CVD–Coated TiN, ZrN and HfN", Solar Energy Materials, 7 (1983) pp. 401–411.

C. G. Ribbing et al., "Optical Properties of Noble Metal Like Films", Thin Film Techologies II, SPIE vol. 652, (1986) pp. 166–178.

Valkonen et al., "Selective Transition of Thin TiN–Films", SPIE Int. Soc. Opt. Eng., 1983, pp. 375–380.

Chemical Abstracts, vol. 111. No. 2, Jul. 10, 1989, Columbus, Ohio, US; abstract No. 11542q, p. 271; JP 63–242,948.

Chemical Abstracts, vol. 114, No. 18, May 6, 1991, Columbus, Ohio, US; abstract No. 169829k, p. 346, JP 02–233,534.

"Properties of d.c. Magnetron Sputtered $NiSiO_x$–Films"by J. Szczyrbowski et al., SPIE vol. 1272, pp. 38–45, *Optical Materials Technology for Energy and Solar Energy Conversion IX* (1990).

(List continued on next page.)

*Primary Examiner*—Steven Versteeg
(74) *Attorney, Agent, or Firm*—Jacques B. Miles

(57) ABSTRACT

Silicon-chromium cathode targets having 5 to 80 weight percent chromium are used to sputter absorbing coatings of silicon-chromium-containing material in atmospheres of inert gas such as argon, reactive gases such as nitrogen, oxygen, and mixtures thereof to form metallic films and films of nitrides, oxides, and oxynitrides of metals. Chromium in the cathode target in the range of 5 to 80 weight percent provides target stability and enhanced sputtering rates over targets of silicon alone and are comparable to the target stability and sputtering rates of silicon-nickel targets, Chromium in the target may be replaced in part with nickel, preferably in the range of 5 to 15 weight percent, to produce coatings of silicon-chromium-nickel and the oxides, nitrides and oxynitrides thereof.

16 Claims, 2 Drawing Sheets

OTHER PUBLICATIONS

Francois et al., "Reflectivity of $ScN_x$ Thin Films: Comparison with $TiN_x$, $TiN_xC_y$, $ZrN_x$ Coatings and Application to the Photothermal Conversation of Solar Energy", *Thin Solid Films*, 127 (1985) pp. 205–214.

U.S. patent Appln. Ser. No. 07/799,806 filed Nov. 29, 1991, now U.S. patent No. 6,274,244 (included above).

U.S. patent Appln. Ser. No. 07/981,706 filed Nov. 25, 1992, now U.S. patent No. 6,139,969 (included above).

U.S. patent Appln. Ser. No. 08/041,015 filed Mar. 31, 1993, now U.S. patent No. 5,417,827 (included above).

U.S. patent Appln. Ser. No. 08/398,932 filed Mar. 6, 1995, now U.S. patent No. 5,709,938 (included above).

U.S. patent Appln. Ser. No. 08/929,176 filed Sep. 8, 1997, now U.S. patent No. 6,365,014 (included above).

CATHODE TARGETS OF SILICON AND TRANSITION METAL

CROSS-REFERENCE TO RELATED APPLICATION

This application is a continuation-in-part of U.S. application Ser. No. 08/929,176 filed Sep. 8, 1997, entitled "Cathode Targets of Silicon and Transition Metal", now U.S. Pat. No. 6,365,014B2, which through a continuing application of U.S. Application filed Sep. 1, 1999, and now abandoned, was a division application of U.S. application Ser. No. 08/398,932, filed Mar. 6, 1995, now U.S. Pat. No. 5,709,938 which is a continuation-in-part of U.S. application Ser. No. 08/041,015 filed Mar. 31, 1993, entitled "Cathode Targets of Silicon and Transition Metal", now U.S. Pat. No. 5,417,827, which is a continuation-in-part of U.S. application Ser. No. 07/981,706 filed Nov. 25, 1992, entitled "Reactive Sputtering of Silicon and Transition Metal", now U.S. Pat. No. 6,139,969, which is a continuation-in-part of U.S. application Ser. No. 07/799,806 filed Nov. 29, 1991, entitled "Multilayer Heat Processable Vacuum Coatings With Metallic Properties", now U.S. Pat. No. 6,274,244B1.

BACKGROUND

1. Field of the Invention

The present invention relates generally to the art of sputtering silicon-containing target materials and to the art of fabricating cathode targets of silicon alloys comprising transition metal.

2. Description of Technical Considerations

U.S. Pat. Nos. 4,990,234 and 5,170,291 to Szczyrbowski et al. disclose sputtering silica and silicides, such as nickel silicide ($NiSi_2$), in an oxidizing atmosphere to deposit dielectric oxide films.

U.S. Pat. No. 5,320,729 to Narizuka et al. discloses a sputtering target with which a high resistivity thin film consisting of chromium, silicon and oxygen can be produced. The target is formed by selecting the grain size of chromium powder and silicon dioxide powder drying the powders by heating and mixing the dried powders to obtain a mixed powder containing from 20 to 80 percent by weight of chromium, preferably 50 to 80 percent, the remainder being silicon dioxide, packing the mixed powder in a die, and sintering the packed powder by hot pressing to produce a target which has a two phase mixed structure. The sputtering target is used to manufacture thin film resistors and electrical circuits.

SUMMARY OF THE INVENTION

The present invention involves silicon-containing cathode targets such as silicon materials or alloys containing a transition metal such as chromium, chromium-nickel, or iron. Targets of silicon-containing materials of chromium, chromium-nickel or iron may be sputtered in an atmosphere comprising inert gas, nitrogen, oxygen and mixtures thereof to produce silicon-metal containing coatings including oxides, nitrides and oxynitrides, as well as metallic films. The silicon-metal cathode target compositions of the present invention comprise sufficient metal to provide target stability and a desirable sputtering rate.

Adding chromium, which as an oxide or nitride is very hard and chemically resistant, to the silicon provides a mechanically and chemically durable silicon-containing compound coating like a silicon alloy compound coating. When the silicon-containing material such as the alloy is sputtered in pure argon, the resultant silicon-containing coating is harder than silicon.

The purpose of these silicon-containing materials such as without limitation silicon-chromium, silicon-chromium-nickel and silicon-iron alloys is to provide target materials which sputter readily, in inert gas, reactive gas or gas mixtures, to produce extremely durable coatings with variable optical properties. Each target material combination produces coatings with different optical constants, i.e. refractive index and absorption coefficient. These optical constants generally increase as the percentage of chromium, chromium-nickel or iron in the silicon-containing material increases. When sputtered reactively, each target material combination also produces coatings with a range of optical constants, which generally increase as the reactive gas mixture, with or without inert gas such as argon, is varied from oxygen, to combinations of oxygen and nitrogen with increasing proportions of nitrogen, to nitrogen.

DESCRIPTION OF THE INVENTION

Figure 1:
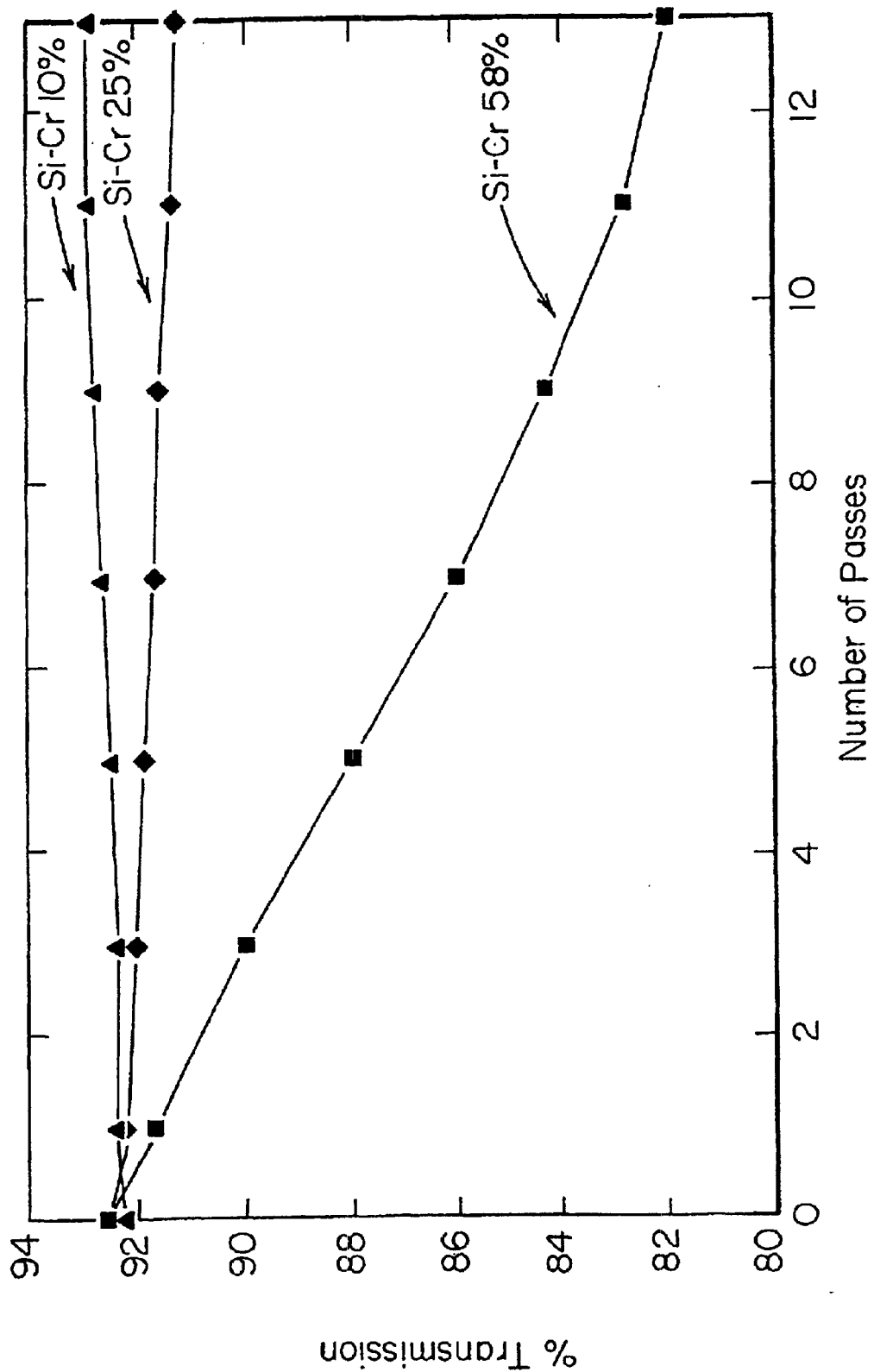
FIG. 1 illustrates the transmittance of coated articles in accordance with the present invention as a function of coating thickness, represented by the number of passes of a substrate under a cathode target of various compositions of silicon and chromium sputtered in an atmosphere of 50 percent oxygen in argon. The cathode target compositions are 10, 25 and 58 weight percent chromium based on the combined weight of chromium and silicon.
Figure 2:
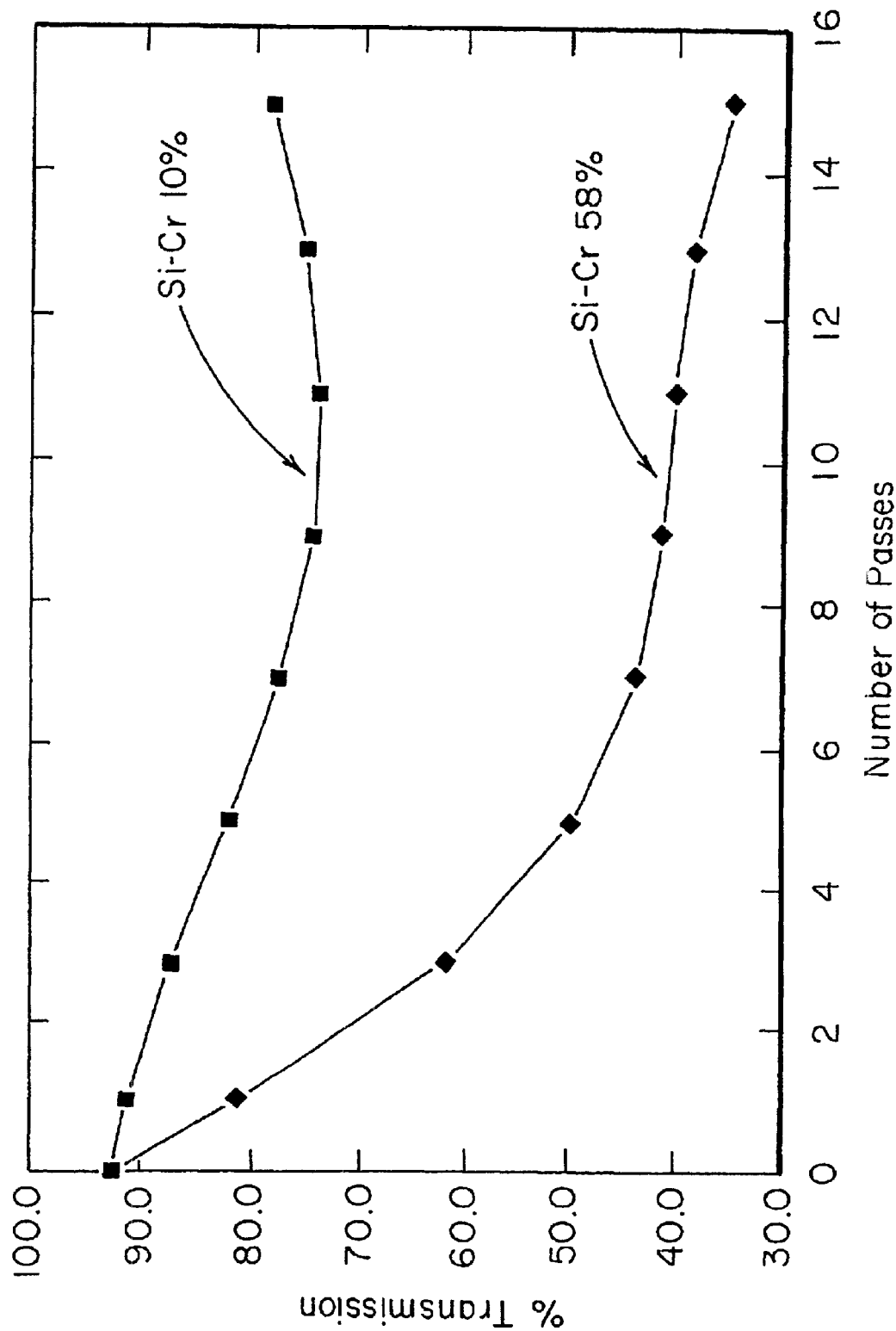
FIG. 2 illustrates the transmittance of coated articles in accordance with the present invention as a function of coating thickness, represented by number of passes of a substrate under a cathode target of various compositions of silicon and chromium sputtered in a nitrogen atmosphere. The cathode target compositions are 10 and 58 weight percent chromium based on the combined weight of chromium and silicon.

In accordance with the present invention, oxides, nitrides and oxynitrides of silicon-chromium, silicon-chromium-nickel and silicon-iron are sputtered using dc magnetron sputtering. For this purpose, silicon-chromium, silicon-chromium-nickel and silicon-iron cathode targets of the present invention are used for the sputtering targets. Coating transmission is measured as an indicator of the optical properties of refractive index and absorption coefficient as shown in FIGS. 1 and 2.

The silicon-chromium, silicon-chromium-nickel, and silicon-iron cathode targets of the invention are found to sputter with arcing and rates comparable to silicon-nickel alloys. Since it is desirable in a production process to use the same target material for many coating applications and vary the reactive gas to sputter different compositions, the chromium, chromium-nickel or iron content in accordance with the present invention is kept high enough to give the desirable sputtering rate and target stability.

Silicon-chromium cathode targets ranging between 5 and 80 weight percent, preferably 10 to 60 weight percent, most preferably 10 to 50 weight percent, chromium are sputtered in argon, nitrogen, and/or oxygen; preferably in an argon-oxygen gas mixture with up to 50 percent oxygen, or in a nitrogen-oxygen gas mixture containing up to 40 percent oxygen. Silicon-chromium cathode targets like silicon-chromium alloy targets may have some of the chromium substituted with nickel. The amount of nickel is preferably below 25 percent by weight based on the combined weight of silicon, chromium and nickel. The amount of nickel can be 20 percent or lower, for instance, in the range of 5 to 15 percent, with at least 5 percent chromium based on the total weight of silicon, chromium and nickel in the silicon-containing material target.

The silicon-chromium-nickel cathode targets can have 5 to 25 weight percent nickel and 5 to 65 weight percent chromium, for instance, 5 to 10 weight percent nickel and 5 to 40 weight percent chromium. Any of the targets of the present invention can be made by any method known to those skilled in the art. To provide the chromium and nickel, nickel and chromium alloys can be used such as NICHROME and/or NICHROME V nickel-chrome alloy. The former is a 60% nickel and 15% chromium alloy which also contains 1% silicon which helps keep scaling to a minimum. NICHROME V alloy is similar to NICHROME alloy but this alloy has a higher nickel content—80% nickel and 20% chromium. NICHROME V alloy is also referred to as NICHROTHAL 8 or CHROMAL 8. NICHROME V alloy is a registered trademark of Driver-Harris Company. The silicon-chromium-nickel cathode targets are preferably sputtered in inert gas such as argon, in argon-oxygen gas mixtures with up to 50 percent oxygen, and in nitrogen-oxygen gas mixtures containing up to 40 percent oxygen. Silicon-iron cathode targets like silicon-iron alloy can have up to 20 weight percent iron based on the combined weight of silicon, but may contain more iron or other transition metal subject to the limitation that the material like an alloy remain nonmagnetic for magnetron sputtering.

The silicon-chromium, silicon-chromium-nickel and silicon-iron cathode target compositions of the present invention are determined by the DC Plasma Emission method from pieces of target material to determine weight percent of chromium, nickel or iron. The coating compositions are measured using X-ray fluorescence to determine the weight percent chromium, nickel or iron.

In particularly preferred embodiments of the present invention, as illustrated in FIGS. 1 and 2, silicon-chromium alloys having compositions with 58, 25 and 10 percent weight chromium are reactively sputtered. The alloy containing 58 percent chromium deposits a coating with strong absorption both as an oxide and nitride, as indicated by the decrease in transmission with increasing number of passes. The alloy containing 25 percent chromium deposits a coating that shows some absorption as an oxide. The alloy containing 10 percent chromium deposits a coating which, as an oxide, shows insignificant absorption, and a refractive index which is less than the refractive index of the glass substrate. This is evident because the transmission increases above that of the substrate (6.0 mm float glass) as the coating is deposited. The nitride coatings of all the alloys containing chromium show strong absorption. FIGS. 1 and 2 illustrate these properties of the oxide and nitride respectively. As shown in FIG. 1, the coating transmission as a function of coating thickness, shown as number of passes, indicates that the absorption and the refractive index of the coatings generally increase as the chromium content increases.

In a preferred embodiment of the present invention, coatings are produced on a large-scale magnetron sputtering device capable of coating glass up to 100×144 inches (2.54×3.66 meters). In the following examples, the coatings are deposited on a smaller scale, using planar magnetron cathodes having 5×17 inch (12.7×43.2 centimeters) silicon-chromium targets. Base pressure is in the $10^{-6}$ Torr range. The coatings are made by first admitting the sputtering gas to a pressure of 4 millitorr and then setting the cathode at constant power of 3 kilowatts (kw). In each example, 6 millimeter thick glass substrates pass under the target on a conveyor roll at a speed of 120 inches (3.05 meters) per minute. The transmittance is monitored every other pass during the sputtering process at a wavelength of 550 nanometers using a Dyn-Optics 580D optical monitor.

After the coating is deposited, the transmittance and reflectance from both the glass and coated surface are measured in the wavelength range from 380 to 720 nanometers using a Pacific Scientific Spectrogard Color System spectrophotometer. These data are used to calculate the coating refractive index n and absorption coefficient k shown in the figures for 560 nanometers. The thicknesses of the coatings are measured using Tencor P-1 Long Scan Profiler.

EXAMPLE 1

A sample is prepared using a silicon-chromium cathode target containing 58 weight percent chromium in an oxygen-argon gas mixture with an oxygen flow of 106 standard cubic centimeters per minute (sccm) and an argon flow of 108 sccm. The cathode voltage is 548 volts. The sputtered film deposited in this oxygen-argon gas mixture is 58 weight percent chromium based on the total weight of silicon and chromium in the film. The transmittance of the coating, monitored at 550 nanometers, is 81.2 percent after 29 passes. The coating thickness is 1593 Angstroms.

EXAMPLE 2

A sample is prepared using a silicon-chromium cathode target containing 25 weight percent chromium in an oxygen-argon gas mixture with an oxygen flow of 46 sccm and an argon flow of 46 sccm. The cathode voltage is 381 volts. The sputtered film deposited in this oxygen-argon gas mixture is 23 weight percent chromium based on the total weight of silicon and chromium in the film. The transmittance of the coating, monitored at 550 nanometers, is 89.8 percent after 39 passes. The coating thickness is 2123 Angstroms.

EXAMPLE 3

A sample is prepared using a silicon-chromium cathode target containing 10 weight percent chromium in an oxygen-argon gas mixture with an oxygen flow of 46 sccm and an argon flow of 46 sccm. The cathode voltage is 348 volts. The sputtered film deposited in this oxygen-argon gas mixture is 8.2 weight percent chromium based on the total weight of silicon and chromium in the film. The transmittance of the coating, monitored at 550 nanometers, is 92.8 percent after 16 passes. The coating thickness is 1044 Angstroms.

EXAMPLE 4

A sample is prepared using a silicon-chromium cathode target containing 58 weight percent chromium in pure nitrogen gas atmosphere with a flow of 158 standard cubic centimeters per minute (sccm). The cathode voltage is 564 volts. The transmittance of the coating, monitored at 550 nanometers, is 9.8 percent after 35 passes.

EXAMPLE 5

A sample is prepared using a silicon-chromium cathode target containing 10 weight percent chromium in pure nitrogen gas atmosphere with a flow of 100 standard cubic centimeters per minute (sccm). The cathode voltage is 495 volts. The sputtered film deposited in this nitrogen gas is 10.3 weight percent chromium based on the total weight of silicon and chromium in the film. The transmittance of the coating, monitored at 550 nanometers, is 80.0 percent after 16 passes. The coating thickness is 1053 Angstroms.

EXAMPLE 6

A sample is prepared using a silicon-chromium-nickel cathode target containing 5 weight percent chromium and 15 weight percent nickel in pure nitrogen gas atmosphere with a flow of 160 standard cubic centimeters per minute (sccm). The cathode voltage is 517 volts. The sputtered film deposited in this nitrogen gas is 4.8 weight percent chromium and 15.5 weight percent nickel based on the total weight of silicon, chromium, and nickel in the film. The transmittance of the coating, monitored at 550 nanometers, is 66.7 percent after 12 passes. The coating thickness is 782 Angstroms.

EXAMPLE 7

A sample is prepared using a silicon-chromium-nickel cathode target containing 10 weight percent chromium and 10 weight percent nickel in pure nitrogen gas atmosphere with a flow of 102 standard cubic centimeters per minute (sccm). The cathode voltage is 506 volts. The sputtered film deposited in this nitrogen gas is 9.6 weight percent chromium and 10.4 weight percent nickel based on the total weight of silicon, chromium, and nickel in the film. The transmittance of the coating, monitored at 550 nanometers, is 68.0 percent after 12 passes. The coating thickness is 750 Angstroms.

EXAMPLE 8

A sample is prepared using a silicon-chromium-nickel cathode target containing 5 weight percent chromium and 15 weight percent nickel in an oxygen-argon gas mixture with an oxygen flow of 75 sccm and an argon flow of 75 sccm. The cathode voltage is 373 volts. The sputtered film deposited in this oxygen-argon gas mixture is 4.1 weight percent chromium and 11.3 weight percent nickel based on the total weight of silicon, chromium, and nickel in the film. The transmittance of the coating, monitored at 550 nanometers, is 89.0 percent after 12 passes. The coating thickness is 781 Angstroms.

EXAMPLE 9

A sample is prepared using a silicon-chromium-nickel cathode target containing 10 weight percent chromium and 10 weight percent nickel in an oxygen-argon gas mixture with an oxygen flow of 44 sccm and an argon flow of 44 sccm. The cathode voltage is 377 volts. The sputtered film deposited in this oxygen-argon gas mixture is 9.3 weight percent chromium and 7.3 weight percent nickel based on the total weight of silicon, chromium, and nickel in the film. The transmittance of the coating, monitored at 550 nanometers, is 91.9 percent after 12 passes. The coating thickness is 704 Angstroms.

EXAMPLE 10

A sample is prepared using a silicon-iron cathode target containing 8 weight percent iron in pure nitrogen gas atmosphere with a flow of 92 sccm. The cathode voltage is 475 volts. The transmittance of the coating, monitored at 550 nanometers, is 80.3 percent after 14 passes The coating thickness is 698 Angstroms.

EXAMPLE 11

A sample is prepared using a silicon-chromium-nickel cathode target containing 5 weight percent chromium and 14 weight percent nickel in pure argon gas atmosphere with a flow of 136 sccm. The cathode voltage is 932 volts. The transmittance of the coating, monitored at 550 nanometers, is 3.2 percent after 6 passes. The coating thickness is 732 Angstroms.

The above examples illustrate the present invention which relates to using silicon-chromium, silicon-chromium-nickel and silicon-iron cathode targets sputtered in pure nitrogen, in nitrogen-oxygen mixtures ranging up to 40 percent oxygen, and in argon-oxygen mixtures comprising up to 50 percent oxygen. Based on the data illustrated in the figures, a single silicon-alloy cathode target containing a given weight percentage of chromium, chromium-nickel or iron can be used for stable sputtering of a range of film compositions including oxides, nitrides and oxynitrides with varying absorption at high sputtering rates. The above examples illustrate the concept of the present invention, the scope of which is defined by the following claims.

What is claimed is:

1. A cathode target comprising:
   a. silicon; and
   b. transition metals selected from the group consisting of:
   i) chromium, wherein the amount of chromium is between 5 and 25 weight percent and the amount of silicon is from 75 to 95 weight percent; and ii) chromium and nickel wherein the target has a weight percent of nickel of 5 up to 15, at least 5 weight percent of chromium, and a weight percent of silicon of more than 30 where all weight percents are based on the combined weight of silicon, chromium and nickel; and iii) iron wherein the target has an amount of iron up to about 8 weight percent based on the combined weight of silicon and iron.

2. A method for depositing coatings comprising silicon-containing materials comprising the steps of:
   a. providing a cathode target according to claim 1, and
   b. sputtering said target to deposit a coating on a surface of a substrate.

3. A cathode target according to claim 1, wherein the target comprises silicon and the transition metals of ii) the weight percent of the silicon in the target is 42 or more.

4. A cathode target according to claim 1 consisting essentially of silicon and chromium.

5. A silicon-containing cathode target, comprising:
   a. silicon; and
   b. transition metals selected from the group consisting of:
   i) chromium and nickel wherein the target has a weight percent of nickel of from 5 to 15 percent, and a weight percent of chromium from 5 to 20 percent, and a weight percent of silicon of more than 30 based on the combined weight of silicon, chromium and nickel; and ii) iron wherein the target has an amount of iron up to about 8 weight percent based on the combined weight of silicon and iron.

6. A method for depositing coatings comprising silicon comprising the steps of:
   a. maintaining a glass substrate in an evacuated chamber;
   b. maintaining an atmosphere comprising a gas selected from the group consisting of inert gas, nitrogen, oxygen, and mixtures thereof; and
   c. sputtering a cathode target comprising silicon having silicon and transition metal selected from the group consisting of:
   i) chromium wherein the chromium is present in an amount of 5 to 60 weight percent based on the total weight of silicon and chromium in the silicon and chromium alloy target which consists essentially of chromium and silicon and the gas for the atmosphere is oxygen or oxygen and nitrogen;

ii) chromium wherein the chromium is present in an amount of 5 to 25 weight percent based on the total weight of silicon and chromium in the silicon and chromium target which consists essentially of chromium and silicon;

iii) chromium and nickel, wherein nickel is present in an amount of up to 25 weight percent, at least 5 weight percent of chromium is present, and for the silicon target silicon is present in an amount of a weight percent of more than 30 based on the combined weight of silicon, chromium and nickel and where the gas for the atmosphere is oxygen or oxygen and nitrogen;

iv) chromium and nickel, wherein nickel is present in an amount of 5 to 15 weight percent, with at least 5 weight percent of chromium is present, and for the silicon target silicon is present in an amount of a weight percent of more than 30 based on the combined weight of silicon, chromium, and nickel; and v) iron wherein the silicon iron target has up to about 20 weight percent iron based on the combined weight of silicon and iron to deposit a coating on a surface of the substrate.

7. A method according to claim 6, wherein the atmosphere consists essentially of inert gas, and the coating consists essentially of silicon and 5 to 25 weight percent chromium based on the total weight of silicon and chromium.

8. A method according to claim 6, wherein the cathode target comprises silicon and the transition metal of c(ii) and the atmosphere comprises nitrogen, and the coating comprises silicon-chromium nitride.

9. A method according to claim 6, wherein the atmosphere comprises nitrogen and oxygen, and the coating comprises silicon-chromium oxynitride.

10. A method according to claim 6, wherein the atmosphere comprises oxygen and inert gas, where oxygen is present in the gas mixture in an amount up to 50 percent and the coating comprises silicon-chromium oxide.

11. A method for depositing coatings comprising silicon comprising the steps of:

a. maintaining a glass substrate in an evacuated chamber;

b. maintaining an atmosphere comprising gas selected from the group consisting of inert gas, nitrogen, oxygen, and mixtures thereof; and c. sputtering a cathode target comprising silicon and 5 to 40 weight percent chromium and 5 to 15 weight percent nickel wherein the weight percent is the weight of silicon, chromium and nickel in the target.

12. A method according to claim 11, wherein the atmosphere consists essentially of inert gas and the coating consists essentially of silicon, chromium and nickel.

13. A method according to claim 11, wherein the atmosphere comprises nitrogen, and the coating comprises silicon-chromium-nickel nitride.

14. A method according to claim 11, wherein the atmosphere comprises oxygen and the coating comprises silicon-chromium-nickel oxide.

15. A method according to claim 11, wherein the atmosphere comprises oxygen and nitrogen and the coating comprises silicon-chromium-nickel oxynitride.

16. A cathode target, comprising:

a. silicon; and b. 3 to 25 weight percent of a 80/20 nickel chromium alloy based on the total weight of silicon, nickel, and chromium containing material.

* * * * *